United States Patent [19]

Ishiguro et al.

[11] Patent Number: 5,065,244
[45] Date of Patent: Nov. 12, 1991

[54] AUTOMATIC FINE TUNING CIRCUIT

[75] Inventors: Satoshi Ishiguro, Kanagawa; Osamu Oda, Tokyo, both of Japan

[73] Assignee: Sony Corporation, Tokyo, Japan

[21] Appl. No.: 544,609

[22] Filed: Jun. 27, 1990

[30] Foreign Application Priority Data

Jul. 11, 1989 [JP] Japan ................................ 1-178588

[51] Int. Cl.[5] .............................................. H04N 5/50
[52] U.S. Cl. ............................. 358/195.1; 358/193.1; 455/182; 455/164
[58] Field of Search ............... 358/191.1, 195.1, 193.1; 455/173, 192, 182, 164

[56] References Cited

U.S. PATENT DOCUMENTS

| | | | |
|---|---|---|---|
| 4,031,549 | 6/1977 | Rast et al. | 358/195.1 |
| 4,236,182 | 11/1980 | Minoura et al. | 358/191.1 |
| 4,241,450 | 12/1980 | Blatter et al. | 358/195.1 |
| 4,405,947 | 9/1983 | Tults et al. | 455/164 |
| 4,422,096 | 12/1983 | Henderson | 358/195.1 |
| 4,484,221 | 11/1984 | Tults | 358/191.1 |
| 4,575,761 | 3/1986 | Carlson et al. | 358/191.1 |
| 4,594,611 | 6/1986 | Sugibayashi et al. | 455/192 |
| 4,689,685 | 8/1987 | Testin et al. | 358/195.1 |
| 4,763,195 | 8/1988 | Tults | 358/191.1 |
| 4,805,230 | 2/1989 | Tanaka | 358/191.1 |
| 4,819,069 | 4/1989 | Tanaka | 455/192 |

FOREIGN PATENT DOCUMENTS

| | | | |
|---|---|---|---|
| 0147884 | 11/1980 | Japan | 358/191.1 |
| 0152717 | 8/1984 | Japan | 358/191.1 |
| 0194679 | 10/1985 | Japan | 358/191.1 |

Primary Examiner—James J. Groody
Assistant Examiner—Jeffrey S. Murrell
Attorney, Agent, or Firm—Philip M. Shaw, Jr.

[57] ABSTRACT

During channel selection on automatic fine tuning (AFT) operation is carried out over a period longer than one vertical scanning period.

5 Claims, 2 Drawing Sheets

AUTOMATIC FINE TUNING CIRCUIT

BACKGROUND OF THE INVENTION

1. Field of the Invention

The present invention relates generally to television receivers and, more particularly, is directed to an automatic fine tuning (AFT) circuit for use with a television receiver in which the AFT operation can be readily pulled in.

2. Description of the Prior Art

As a channel selecting apparatus of, for example, a television receiver, a synthesizer tuner having a phase locked loop (PLL) circuit is utilized frequently. Such a synthesizer tuner can stably receive a television signal if the frequency of the television signal is inherently accurate.

Recently, it is frequently observed that the frequency of an RF (radio frequency) signal in the re-transmission of television signal in a so-called CATV, a video tape recorder (VTR), a television game machine or the like is offset from the original frequency. Further, in the CATV, in order to avoid the disturbance from the adjacent channel or the like, the frequency of the RF signal is offset from the original frequency by about 1 MHz.

Therefore, it is proposed to provide a so-called automatic fine tuning (AFT) circuit in the synthesizer tuner to pull-in the receiving signal having an offset frequency (see U.S. Pat. No. 4,422,096). Further, Japanese Patent Laid-Open Gazette No. 63-174483 describes a wide AFT in which the AFT operation is sequentially carried out at five to six channel-selection points within a channel so as to substantially widen the range in which the AFT operation is pulled-in.

In the above-described AFT circuit, in the stationary state, an AFT signal detecting period is restricted within only a vertical blanking period, whereby a fluctuation of the AFT signal caused by a level change of the video signal is removed, thus stabilizing the AFT operation (see Japanese Patent Laid-Open Gazette No. 63-135075).

However, under the condition that the synchronization of a receiving signal is not established, such as when a television channel is selected, the vertical blanking period of the receiving signal and an AFT detecting period, determined at the television receiver side, are not coincident with each other. In that case, if the receiving signal is a video signal of normal level, a satisfactory AFT control signal is obtained in a period other than the vertical blanking period.

If, for example, the receiving signal is a video signal having a high average picture level (APL), the level of the IF (intermediate frequency) signal is lowered during the video signal period so that the level of the AFT signal is lowered. Consequently, an AFT signal of sufficiently high level can not be obtained in the detecting period in which the receiving signal is not synchronized. There are then the substantial disadvantages that a malfunction will occur and that the AFT operation will not be pulled in with plenty of time.

OBJECTS AND SUMMARY OF THE INVENTION

Accordingly, it is an object of the present invention to provide an improved AFT circuit which avoids the aforenoted shortcomings and disadvantages of the prior art More specifically, it is an object of the present invention to provide an AFT circuit in which an AFT operation can be pulled in rapidly and positively.

As an aspect of the present invention, at least during a channel selection period, an AFT detecting period is made longer than one vertical scanning period, and after the AFT operation is pulled in, the AFT detecting period is restricted within the vertical blanking period. Accordingly, at least during the channel selection period, the AFT detecting period is made longer than one vertical scanning period, whereby the detection of the AFT signal can be carried out positively. Thus, the AFT operation can be pulled in satisfactorily and rapidly.

The above, and other objects, features and advantages of the present invention, will be apparent in the following detailed description of a preferred embodiment of the invention when read in conjunction with the accompanying drawings, in which like reference numerals are used to identify the same or similar parts in the several views.

DETAILED DESCRIPTION OF THE PREFERRED EMBODIMENT

An embodiment of an automatic fine tuning (AFT) circuit according to the present invention will be described with reference to FIGS. 1 and 2.

Figure 1:
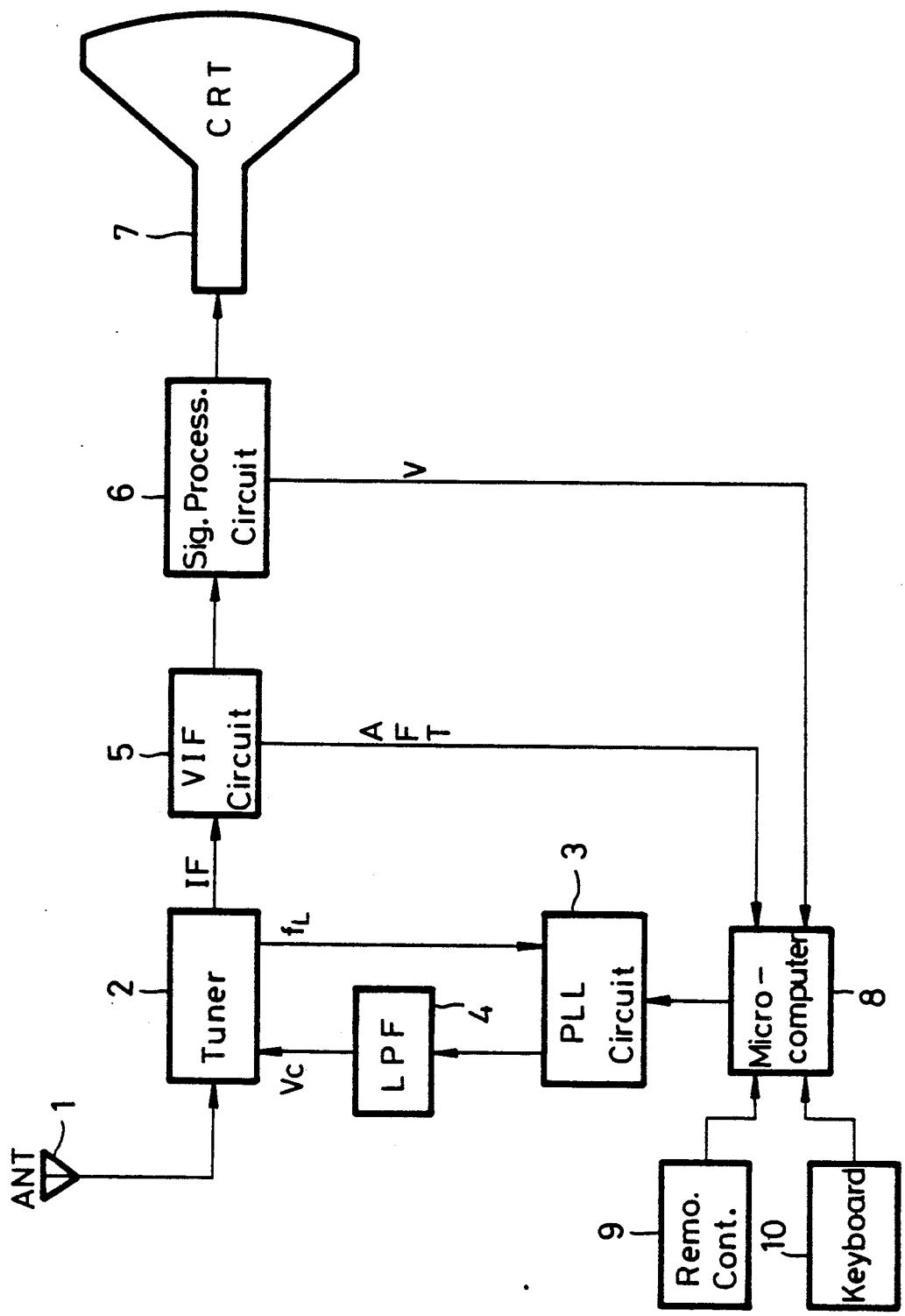
FIG. 1 is a block diagram showing an embodiment of an AFT circuit according to the present invention.

FIG. 1 is a schematic block diagram of a television receiver to which the present invention is suitably applied.

It will be seen in FIG. 1 that a television signal is received at an antenna 1 and this received signal is supplied to a tuner 2. The tuner 2 is also supplied with a channel selection voltage Vc produced by a phase locked loop (PLL) circuit 3 and a low-pass filter (LPF) 4 and, a local oscillation signal $f_L$ from the tuner 2 is supplied to the PLL circuit 3.

Thus, a desired television signal is received on the basis of a numerical value set in the PLL circuit 3. The received signal IF from the tuner circuit 2 is supplied to a video intermediate frequency (VIF) circuit 5 including a video detector circuit, and the demodulated video signal from the VIF circuit 5 is supplied through a signal processing circuit 6 to a cathode ray tube (CRT) 7, whereby a desired television signal is reproduced on the CRT 7 as a picture.

A microcomputer 8 receives control signals from a remote control circuit 9 and a keyboard 10 and generates a predetermined numerical value in order to receive a desired television signal. This numerical value is set in the PLL circuit 3.

Further, the VIF circuit 5 derives an automatic fine tuning (AFT) signal. This AFT signal is supplied to the microcomputer 8, and a vertical sync. (i.e., synchronizing) signal V separated from the video signal by, for example, the signal processing circuit 6 is supplied to the microcomputer 8.

Accordingly, in this circuit arrangement, in the stationary state, on the basis of the vertical sync. signal V from the signal processing circuit 6, the AFT signal is detected during a vertical blanking period and the AFT signal is controlled to have a predetermined level. Thus, the AFT operation is performed.

In the channel switching mode, a different operation is performed by the microcomputer 8.

Figure 2:
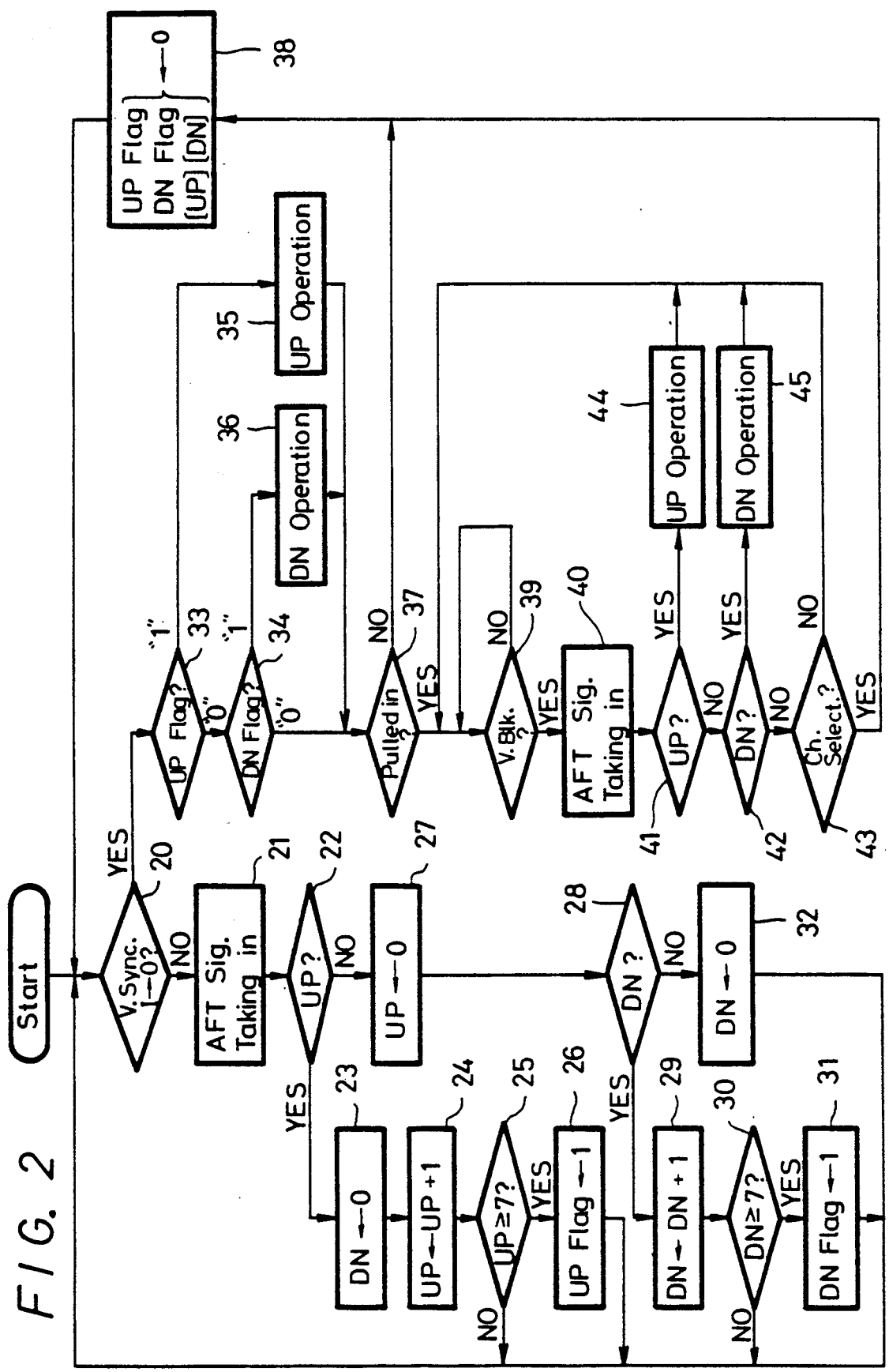
FIG. 2 is a flow chart to which reference will be made in explaining an operation of the AFT circuit shown in FIG. 1.

The overall AFT operation of this invention is represented in the flow chart forming FIG. 2. In FIG. 2, step 20, steps 35, 36, 39 to 42 and steps 44, 45 are executed in the prior art and steps 21 to 34, 37, 38 and 43 are additionally executed in the present invention.

Referring to FIG. 2, switching ON the power switch of the television receiver and following the Start of operation, it is initially determined in decision step 20 whether or not the self-oscillating vertical sync. signal in the signal processing circuit 6 goes to "0" from "1". If a NO is output at step 20, this means a portion other than the front edge portion of the vertical synchronizing signal is being processed. Then, the routine goes to step 21, whereat the AFT signal from the VIF circuit 5 is taken in. It is determined in the next decision step 22 whether or not the signal taken in is a signal which increases (UP) the reception frequency. If a YES is output at step 22, then the routine proceeds to step 23, whereat a count value [DN] for counting the number of down (DN) signals, which will be described later, is reset to "0". In the next step 24, a count value [UP] for counting the number of up signals is incremented by "1". It is determined in the next decision step 25 whether or not the count value [UP] is larger than "7". If the count value [UP] is larger than "7", as represented by a YES at step 25, then the routine proceeds to step 26, whereat the UP flag is set to "1", and the routine returns to step 20. If the count value [UP] is not larger than "7", as represented by a NO at step 25, then the routine directly returns to step 20.

If it is determined that the AFT signal is not the UP signal, as represented by a NO at step 22, the routine proceeds to step 27, wherein the count value [UP] is reset to "0". Then, in the next decision step 28, it is determined whether the AFT signal taken in is a signal which decreases (DN) the reception frequency or not. If the AFT signal is the down signal, as represented by a YES at step 28, then the routine proceeds to step 29, whereat the count value [DN] is incremented by "1". The processing proceeds to the next decision step 30, whereat it is determined whether or not the count value [DN] is larger than "7". If the count value [DN] is larger than "7", as represented by a YES at step 30, the routine proceeds to step 31, whereat the DN flag is set to "1", and the routine returns to step 20. If the count value [DN] is not larger than "7", as represented by a NO at step 30, then the routine directly returns to step 20.

If the identified AFT signal is not the down (DN) signal, represented by a NO at step 28, then the count value [DN] is reset to "0" at step 32, and the routine goes back to step 20.

On the other hand, if it is determined that the vertical sync. signal goes to "0" from "1", as represented by a YES at step 20, this means that the front edge portion of the vertical sync. signal is being received. Then, the routine proceeds to the next decision steps 33 and 34, whereat the UP flag and DN flag are identified. If any one of UP and DN flags is "1", the corresponding up (UP) o down (DN) operation is executed at step 35 or 36. The up and down operations at steps 35 and 36 are wide automatic fine tuning operations described in the preamble (prior art) of this specification.

At the completion of the steps 35 and 36 or if the UP flag and the DN flag are both "0", as represented by a YES at steps 33 and 34, then the routine proceeds to the next decision step 37, wherein it is determined whether or not the AFT signal is pulled in completely. If the pull-in operation of the AFT signal is not completed, as represented by a NO at step 37, the routine proceeds to step 38, whereat the UP flag, DN flag and count values UP and DN are all reset to "0", and the routine returns to step 20.

If the pull-in operation of the AFT signal is completed, as represented by a YES at step 37, the routine proceeds to the next decision step 39, whereat it is determined on the basis of the vertical sync. signal from the signal processing circuit 6 whether or not the AFT detecting period is within the vertical blanking period. At a timing point in which the pull-in operation of the AFT signal is completed, the vertical sync. signal from the signal processing circuit 6 is synchronized with the reception signal. If the AFT detecting period is not restricted within the vertical blanking period, as represented by a NO at step 39, the step 39 is repeated.

If the AFT detecting period falls within the vertical blanking period, as represented by a YES at step 39, the AFT signal is taken in at step 40. Then, in the next decision steps 41 and 42, it is determined whether or not the UP signal and the DN signal exist. Further, it is determined at the next decision step 43 whether or not the channel select command is issued. If neither the UP signal and the DN signal exist nor the channel select command is issued, as represented by a NO at steps 41, 42 and 43, the routine returns to step 39.

If the AFT control signal exists in any one of the two steps 41 and 42, as represented by a YES, then the routine goes to steps 44 and 45, whereat the corresponding up and down operations are performed, and then the routines return to step 39. Further, if the channel select command is issued, as represented by a YES at step 43, the routine proceeds to step 38.

The above-mentioned processings at steps 39 to 43 and steps 44 and 45 are executed in the stationary state. In the stationary state, these steps 39 to 43 and steps 44 and 45 form an infinite loop and these operations are stopped by turning OFF the power switch and the like.

Accordingly, in the flow chart of FIG. 2, upon channel selection, for example, the loop formed of steps 20 to 32 is repeated to successively detect the AFT signal, which is detected in the absence of the self-oscillating vertical sync. signal from the signal processing circuit 6. Therefore, during this identification, the detection of the AFT signal may continuously be carried out substantially beyond one vertical scanning period. Thus, even if an average picture level (APL) of the video signal is so high that the AFT signal of the vertical scanning period can not be obtained, the AFT signal can be positively detected.

At step 21 in the flow chart forming FIG. 2, the AFT signal can be taken in at the interval of, for example, $100 \times 10^{-6}$ second in the above-mentioned loop. In that case, only when the AFT signal contains more than seven successive up or down signals, the UP flag or the DN flag is set to "1", whereby a malfunction due to the noise component in the signal or the like can be avoided.

As set out above, according to the above-mentioned circuit arrangement, at least during the channel selection period, the AFT signal detecting period is made longer than one vertical scanning period, whereby the AFT signal can be detected positively. Thus, the AFT operation can be pulled-in satisfactorily in a short period of time.

In the flow chart forming FIG. 2, the decision at step 20 may be executed not by the vertical sync. signal but by a timer driven in an interval of longer than $16.7 \times 10^{-3}$ second.

Having described a preferred embodiment of the invention with reference to the accompanying drawings, it is to be understood that the invention is not limited to that precise embodiment and that various changes and modifications could be effected by one skilled in the art without departing from the spirit or scope of the novel concepts of the invention as defined in the appended claims.

We claim as our invention:

1. A television signal receiver comprising:
   a tuner for receiving an RF signal and deriving an IF signal;
   a signal processing circuit including a VIF circuit for processing the IF signal from the tuner;
   a channel selection circuit connected to the tuner; and
   means connected between the VIF circuit and the channel selection circuit for automatically fine tuning the tuner, the means being operated during a predetermined AFT detecting period, characterized in that the AFT detecting period is normally restricted within a vertical blanking period but is made longer than one vertical scanning period during a channel selection period.

2. A television signal receiver according to claim 1, wherein the channel selection circuit is of a PLL type, and wherein the means for automatically fine tuning the tuner includes a microcomputer for controlling the channel selection circuit in response to an IF signal level and a vertical synchronizing signal both detected in the signal processing circuit.

3. A television signal receiver according to claim 2, wherein the means for automatically fine tuning the tuner includes up and down counters.

4. In combination, a television receiver of the type including a tuner, a means for automatically fine tuning the tuner circuit and a signal processing circuit, wherein the AFT circuit operates during a predetermined AFT detecting period, characterized in that the AFT circuit includes means for normally restricting the AFT detecting period within a vertical blanking period and making the AFT detecting period longer than one vertical scanning period during a channel selection period.

5. An AFT circuit for a television receiver, the AFT circuit being operated during a predetermined AFT detecting period, characterized in that the AFT detecting period is firstly made longer than one vertical scanning period when a channel selector is operated and secondly restricted within a vertical blanking period after the AFT operation is pulled in.

* * * * *